United States Patent
Tomimatsu et al.

(10) Patent No.: US 9,020,686 B2
(45) Date of Patent: Apr. 28, 2015

(54) CONTROL APPARATUS FOR VEHICULAR ELECTRIC COMPONENT

(75) Inventors: Chihiro Tomimatsu, Gifu (JP); Katsunori Yazawa, Kasugai (JP)

(73) Assignee: NGK Spark Plug Co., Ltd., Aichi (JP)

( * ) Notice: Subject to any disclaimer, the term of this patent is extended or adjusted under 35 U.S.C. 154(b) by 196 days.

(21) Appl. No.: 13/245,718

(22) Filed: Sep. 26, 2011

(65) Prior Publication Data

US 2012/0078461 A1 Mar. 29, 2012

(30) Foreign Application Priority Data

Sep. 27, 2010 (JP) .................................. 2010-215145

(51) Int. Cl.
 *G01M 17/00* (2006.01)
 *G01R 31/00* (2006.01)
 *G01R 31/02* (2006.01)
 *G01R 31/36* (2006.01)

(52) U.S. Cl.
 CPC ............ *G01R 31/007* (2013.01); *G01R 31/025* (2013.01); *G01R 31/3606* (2013.01)

(58) Field of Classification Search
 CPC . G01R 31/007; G01R 31/025; G01R 31/3606
 USPC .......... 701/29.7, 29.8, 30.3, 30.5, 30.8, 30.9, 701/31.1
 See application file for complete search history.

(56) References Cited

U.S. PATENT DOCUMENTS

| 4,339,801 A | 7/1982 | Hosaka et al. |
| RE31,582 E | 5/1984 | Hosaka et al. |
| 5,504,682 A * | 4/1996 | Shiraishi et al. ............... 701/111 |
| 6,357,288 B1 | 3/2002 | Shigihama et al. |

(Continued)

FOREIGN PATENT DOCUMENTS

| JP | 55-128641 A | 10/1980 |
| JP | 8-177608 A | 7/1996 |

(Continued)

OTHER PUBLICATIONS

Japanese Office Action dated Oct. 30, 2012, issued in corresponding Japanese Patent Application No. 2010-215145.

*Primary Examiner* — Helal A Algahaim
*Assistant Examiner* — Donald J Wallace
(74) *Attorney, Agent, or Firm* — Sughrue Mion, PLLC (57) ABSTRACT

A sensor control apparatus connected to a gas sensor includes a microcomputer containing a ROM (first storage section), and an EEPROM (second storage section) independently of the ROM. The ROM stores an anomaly diagnosis program containing at least one type of anomaly determination process. The EEPROM stores one or more flags set so as to represent whether the corresponding anomaly determination process is valid or invalid. The states of the one or more flags can be readily changed from an externally connected PC. A CPU executes a series of processing steps of the anomaly determination processes, and then obtains a determination result thereof when the CPU determines that the anomaly determination process is valid, with reference to the one or more flags.

2 Claims, 6 Drawing Sheets (56) References Cited

U.S. PATENT DOCUMENTS

| | | | |
|---|---|---|---|
| 6,615,119 B1 * | 9/2003 | Shimizu | 701/31.6 |
| 7,092,829 B2 | 8/2006 | Kato et al. | |
| 7,788,005 B2 * | 8/2010 | Enomoto et al. | 701/29.6 |
| 8,041,475 B2 * | 10/2011 | Fujita et al. | 701/30.3 |
| 8,155,823 B2 * | 4/2012 | Itoh | 701/31.7 |
| 8,401,730 B2 * | 3/2013 | Bechtler et al. | 701/29.7 |
| 8,467,929 B2 * | 6/2013 | Bechtler et al. | 701/30.3 |
| 2004/0220776 A1 | 11/2004 | Kato et al. | |
| 2008/0059018 A1 * | 3/2008 | Kueperkoch et al. | 701/34 |
| 2008/0195274 A1 * | 8/2008 | Morozumi | 701/34 |
| 2008/0262687 A1 * | 10/2008 | Fujita et al. | 701/70 |

FOREIGN PATENT DOCUMENTS

| | | |
|---|---|---|
| JP | 2000097810 A | 4/2000 |
| JP | 2000-282972 A | 10/2000 |
| JP | 2001-065403 A | 3/2001 |
| JP | 2004-019457 A | 1/2004 |
| JP | 2004-251897 A | 9/2004 |
| JP | 2005-163706 A | 6/2005 |
| JP | 2007-284027 A | 11/2007 |
| JP | 2008-312010 A | 12/2008 |
| JP | 2009-184429 A | 8/2009 |
| JP | 2010-188748 A | 9/2010 |

* cited by examiner

CONTROL APPARATUS FOR VEHICULAR ELECTRIC COMPONENT

BACKGROUND OF THE INVENTION

1. Field of the Invention

The present invention relates to a control apparatus for a vehicular electric component which controls an electric component attached to a vehicle, and which has a diagnosis function for determining whether or not an anomaly has occurred in the electric component.

2. Description of the Related Art

In an automobile, various electric components, such as a gas sensor, a glow plug and a temperature sensor, are used. A control apparatus which controls such an electric component has a diagnosis function for determining whether or not an anomaly has occurred in the electric component.

In general, a program for anomaly diagnosis is installed in ROM within a microcomputer mounted in a control apparatus, along with a program for controlling the electronic component and other programs. Meanwhile, such a control apparatus is attached to various types of automotive engines, which are controlled by various types of control systems. Therefore, the manner of use of an electric component (for example, application voltage or the like) may change depending on the type of engine and control system to be used. An anomaly diagnosis program having specifications suitable for the type of engine and control system is designed and used.

However, if a dedicated anomaly diagnosis program is prepared for each combination of an engine and control system type, development of the anomaly diagnosis program requires increased man-hours and increased labor. In order to solve such a problem, a control apparatus has been proposed in which an anomaly diagnosis program of an object oriented design is installed (for example, see Patent Document 1). That is, minimum unit programs (anomaly diagnosis functions) which correspond to various types of engines and/or control systems are designed, and an anomaly diagnosis program is prepared by combining necessary programs in accordance with an engine and a control system in which the anomaly diagnosis program is to be installed.

[Patent Document 1] Japanese Patent Application Laid-Open (kokai) No. 2000-97810

3. Problems to be Solved by the Invention

However, a conventional control apparatus has the following problem. For example, in some cases, operation of an anomaly diagnosis function is checked and/or a durability test for an electric component is performed in a state in which a control apparatus is installed in an automobile. In some cases, such a test is performed in a state in which a certain anomaly diagnosis function is temporarily stopped. In the case of the control apparatus disclosed in Patent Document 1, an anomaly diagnosis program is installed in the ROM of the control apparatus. Therefore, when a certain anomaly diagnosis function is to be stopped, it is necessary to prepare an anomaly diagnosis program including a new combination of anomaly diagnosis functions not including the certain anomaly diagnosis function, and to re-install the anomaly diagnosis program.

SUMMARY OF THE INVENTION

The present invention has been accomplished in order to solve the above-described problem, and an object thereof is to provide a control apparatus for a vehicular electric component which can easily validate or invalidate one of two or more arbitrary anomaly detection processes.

The above object has been achieved in accordance with a first aspect (1) of the invention, by providing a control apparatus for controlling a vehicular electric component which executes at least one type of anomaly detection processes, and which drives and controls the electric component mounted on a vehicle. The control apparatus comprises a first storage section which stores the anomaly detection process; a second storage section which is provided independently of the first storage section and which stores a determinant that determines whether the at least one type of anomaly detection processes is valid or invalid; and a computation section for executing the anomaly detection process. When the computation section executes the at least one type of anomaly detection processes, the computation section refers to the determinant stored in the second storage section, and obtains a detection result of the anomaly detection process when the anomaly detection process is determined to be valid.

The validity of at least one type of anomaly detection processes is determined with reference to the determinant, and the detection result of the anomaly detection process is obtained only when the detection result is determined to be valid. Thus, only a proper detection result is obtained depending on the type of vehicle or in accordance with a particular situation. That is, the computation section does not execute an anomaly detection process(es) determined invalid with reference to corresponding determinant(s). Furthermore, since the first storage section, which stores the at least one of anomaly detection processes, and the second storage section, which stores the determinant, differ from each other (are provided independently of each other), changing of the state of the determinant(s) stored in the second storage section is sufficient for obtaining a detection result from a desired anomaly detection process(es). Accordingly, even in the case where the anomaly detection process whose detection result is desired to be obtained changes depending on the type of vehicle or in accordance with the situation, the plurality of processes stored in the first storage section themselves need not be changed. Therefore, the contents of the first storage section do not need to be changed. Making a change of the processes may require a technique of configuring the processes. In contrast, changing the state of the determinant does not require any such technique, and can be readily performed. Therefore, the detection result of a proper anomaly detection process can be obtained in accordance with a particular situation.

In a preferred embodiment (2) according to (1) above, the first storage section stores at least two types of anomaly detection processes; the second storage section stores at least two determinants each being used to determine whether a corresponding one of the at least two types of anomaly detection processes is valid or invalid; and the computation section is configured such that, when the computation section executes each of the anomaly detection processes, the computation section refers to the corresponding determinant stored in the second storage section, and obtains a detection result of the anomaly detection process when the anomaly detection process is determined to be valid.

Since the first storage section stores at least two types of anomaly detection processes and the second storage section, different from the first storage section, stores at least two determinants each being used to determine whether a corresponding one of the at least two types of anomaly detection processes is valid or invalid, one or more of the anomaly detection processes desired by a user of the control apparatus can be executed, without changing the contents of the first storage section. Thus, the flexibility of the control apparatus can be enhanced.

In a preferred embodiment (3) according to (2) above, the at least two types of anomaly detection processes may include a first checking process for checking whether or not the contents of the first storage section are normal (for example, a first checking process for checking whether or not all the contents of the first storage section are normal); and a second checking process for checking whether or not at least one of a short circuit and wire breakage has occurred at a connection line which electrically connects the control apparatus and the electric component.

Operation of the control apparatus can be checked from the viewpoint of software and hardware by checking the contents of the first storage section, and checking whether or not at least one of a short circuit and wire breakage has occurred at the connection line. Therefore, it becomes easier for a user to select the contents of the anomaly diagnosis process of the control apparatus, and the flexibility of the control apparatus itself can be enhanced.

In a preferred embodiment (4) according to any of (1) to (3) above, the computation section is configured such that, when the computation section executes the at least one type of anomaly detection process, the computation section performs the determination with reference to the determinant after having executed a series of processing steps contained in the at least one type of anomaly detection process, and obtains, as a detection result of the at least one type of anomaly detection process, the result of the series of processing steps when the at least one type of anomaly detection process is determined to be valid.

Since the detection result of the at least one type of anomaly detection process is acquired after executing a series of processing steps contained in the anomaly detection process, the processing time of the anomaly detection process does not change greatly between the case where the determinant is set to a state representing "valid" and the case where the determinant is set to a state representing "invalid." Therefore, no delay is imposed on waiting times and timings at which other processes, containing other anomaly detection processes, are executed. Even in the case where the state of one or more of the determinants is changed temporarily, it is unnecessary to adjust the timings of the corresponding processes, etc. Therefore, setting of the determinants can be readily performed, and time and labor can be saved.

DESCRIPTION OF REFERENCE NUMERALS

Reference numerals used to identify various structural features include the following.
1: sensor control apparatus
2: gas sensor
10: microcomputer
11: CPU
12: ROM
30: EEPROM
31: failure diagnosis setting data storage area

DETAILED DESCRIPTION OF THE PREFERRED EMBODIMENTS

One embodiment of a control apparatus for a vehicular electric component of the present invention will be described with reference to the drawings. Notably, the drawings which are referred to herein are used for describing technical features of the present invention. The structures of a sensor, an apparatus, etc., flowcharts of various processes, etc., are mere examples, and are not limited to those illustrated in the drawings, unless otherwise specified.

Figure 1:
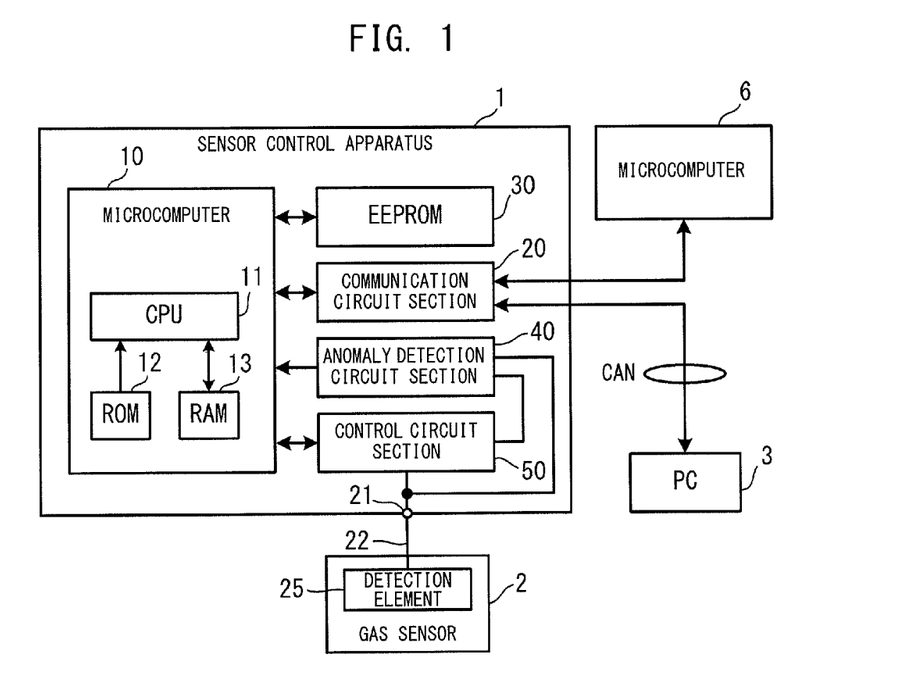
FIG. 1 is a block diagram showing the electrical configuration of a sensor control apparatus 1.

A sensor control apparatus 1 shown in FIG. 1 is an apparatus for driving and controlling a gas sensor 2, which is an electric component to be attached to a vehicle such as an automobile. Examples of the gas sensor 2 include an oxygen sensor, a full range air-fuel-ratio sensor, and an NOx sensor. In the present embodiment, the gas sensor 2 is a full range air-fuel-ratio sensor (a sensor outputting a signal which changes linearly in accordance with oxygen concentration), which includes a detection element 25 having two cells each composed of a solid electrolyte member formed of zirconia or the like, and a pair of electrodes sandwiching the solid electrolyte member. Notably, examples of the vehicular electric components, other than the gas sensor, include other types of sensors, such as a urea concentration sensor and a temperature sensor; glow plugs; and injectors.

The sensor control apparatus 1 starts upon receipt of a signal supplied from a microcomputer 6 of an ECU (electronic control apparatus) of an automobile, and performs drive control (energization control) for driving and controlling the gas sensor 2. Furthermore, the sensor control apparatus 1 calculates oxygen concentration on the basis of an output of the gas sensor 2, and outputs the calculated oxygen concentration to the microcomputer 6.

The sensor control apparatus 1 includes a microcomputer 10, EEPROM 30, a communication circuit section 20, an anomaly detection circuit section 40, a control circuit section 50, etc. The microcomputer 10 includes a CPU 11, ROM 12, and RAM 13, which are well known. The CPU 11 executes various programs, including an anomaly diagnosis program described below and an oxygen concentration calculation program, so as to control the drive of the gas sensor 2. The ROM 12 stores these various programs, initial values, etc. The RAM 13 temporarily stores various variables, flags, counters, etc., used for execution of the programs. The EEPROM 30, the communication circuit section 20, the anomaly detection circuit section 40, and the control circuit 50 are connected to the microcomputer 10.

Figure 2:
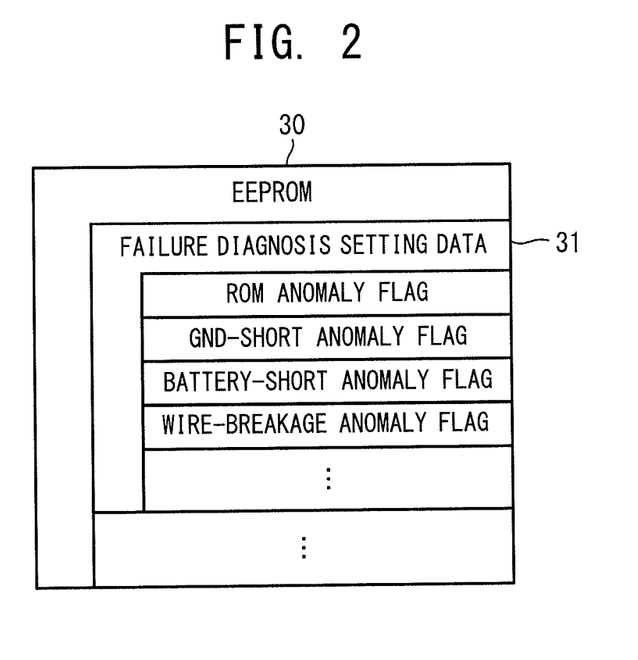
FIG. 2 is a diagram schematically showing the configuration of a storage area of an EEPROM 30.

The EEPROM 30 is a rewritable storage device having a known structure. As shown in FIG. 2, a failure diagnosis setting data storage area 31 is provided in the EEPROM 30. Various flags which are referred to in an anomaly diagnosis program described below are stored in the failure diagnosis setting data storage area 31. Specifically, a ROM anomaly flag, a GND (ground)-short anomaly flag, a battery-short anomaly flag, a wire-breakage anomaly flag, etc., are stored in the failure diagnosis setting data storage area 31. Moreover, various unillustrated storage areas are further provided in the EEPROM 30.

The communication circuit section 20 is connected to the microcomputer 6 of an external unit (an ECU), and exchanges signals with the microcomputer 6. Also, the communication circuit section 20 controls serial communication between the communication circuit section 20 and an external PC (personal computer) 3 performed through a CAN (Controller Area Network). The microcomputer 10 can communicate with the PC 3 via the communication circuit section 20. As described in detail below, the contents of the EEPROM 30 are rewritten in accordance with an instruction from the PC 3.

The control circuit section 50 is a circuit section for driving and controlling the gas sensor 2. The control circuit section 50 is connected to the detection element 25 of the gas sensor 2 via a port 21 and a wiring line 22, and supplies drive current to the detection element 25. The magnitude of current flowing through a cell of the detection element 25 changes in accordance with the oxygen concentration of the atmosphere. The control circuit section 50 converts the current flowing through the cell to a voltage by use of a detection resistor (not shown). The voltage is input to the microcomputer 10. The CPU 11 of the microcomputer 10 calculates an oxygen concentration by making use of a previously set map or a calculation equation under the oxygen concentration calculation program, and outputs the calculated oxygen concentration to the microcomputer 6 of the ECU. Notably, in order to facilitate understanding, FIG. 1 shows only the one single port 21 and only the one wiring line 22, which are connected to the detection element 25. However, in actuality, the gas sensor 2 is connected to the control circuit section 50 and the anomaly detection circuit section 40 as described below via a plurality of ports and a plurality of wiring lines.

The anomaly detection circuit section 40 is a circuit section for detecting an anomaly of a path for supplying electric current to the detection element 25 of the gas sensor 2, such as a short circuit or wire breakage. The anomaly detection circuit section 40 is connected to the port 21, to which the wiring line 22 for connecting the sensor control apparatus 1 and the gas sensor 2 is connected. Also, the anomaly detection circuit section 40 is connected to an unillustrated circuit of the control circuit section 50 for supplying drive current to the gas sensor 2. When an anomaly (short to a battery (not shown), a short to ground, wire breakage, or conduction failure) occurs in the path for supplying electric current to the detection element 25, voltages within the detection element 25 or the control circuit section 50 become anomalous. For example, in the case where a short circuit is formed between the terminals (not shown) of the gas sensor 2, the path for supplying electric current to the detection element 25 is shorted to the battery, which results in an increase in the potential of the port 21, to which the battery voltage is applied. Similarly, when the path for supplying electric current to the detection element 25 is shorted to ground, the potential of the port 21 decreases to ground potential. The anomaly detection circuit section 40 detects the potential (voltage) of the port 21 (in actuality, each of a plurality of ports), and outputs the detected potential to the CPU 11 of the microcomputer 10. Also, the anomaly detection circuit section 40 includes a wire breakage detection circuit (not shown) for determining whether or not wire breakage or conduction failure (wire breakage, etc.) has occurred in the control circuit section 50; specifically, in the path for supplying electric current to the detection element 25. When the anomaly detection circuit section 40 detects the wire breakage, etc., of the path for supplying electric current to the detection element 25, the anomaly detection circuit section 40 outputs a wire breakage detection signal to the CPU 11.

In the sensor control apparatus 1 of the present embodiment, as described above, the contents of the EEPROM 30 can be rewritten by an operator's operation of the PC 3, which is externally connected to the sensor control apparatus 1 via the CAN communication. Specifically, the ON/OFF states of various flags stored in the failure diagnosis setting data storage area 31 of the EEPROM 30 are changed by means of the operator's operation of the PC 3. When each of anomaly determination processes contained in the anomaly diagnosis program is executed, the corresponding flag stored in the failure diagnosis setting data storage area 31 is referred to by other programs executed by the CPU 11. The anomaly diagnosis program is described below.

As described above, the anomaly diagnosis program is stored in the ROM 12 of the microcomputer 10 of the sensor control apparatus 1, and is executed as one of various programs for controlling the drive of the gas sensor 2. The anomaly diagnosis program includes various anomaly determination processes for determining, through diagnosis, an anomalous state which may occur when the sensor control apparatus 1 controls the drive of the gas sensor 2. In the present embodiment, the operation of the anomaly diagnosis program will be described, while four types of anomaly determination processes shown in FIGS. 3 to 6, among the various anomaly determination processes contained in the anomaly diagnosis program, are taken as examples.

Notably, each anomaly determination process is called from an unillustrated main process of the anomaly diagnosis program, and is executed. The main process is repeatedly executed, while the sensor control apparatus 1 operates, and each anomaly determination process is repeatedly called. Each process of the anomaly diagnosis program is executed by the CPU 11 of the microcomputer 10. Hereinafter, each step of the flowchart of each anomaly determination process in the anomaly diagnosis program will be abbreviated to "S."

Figure 3:
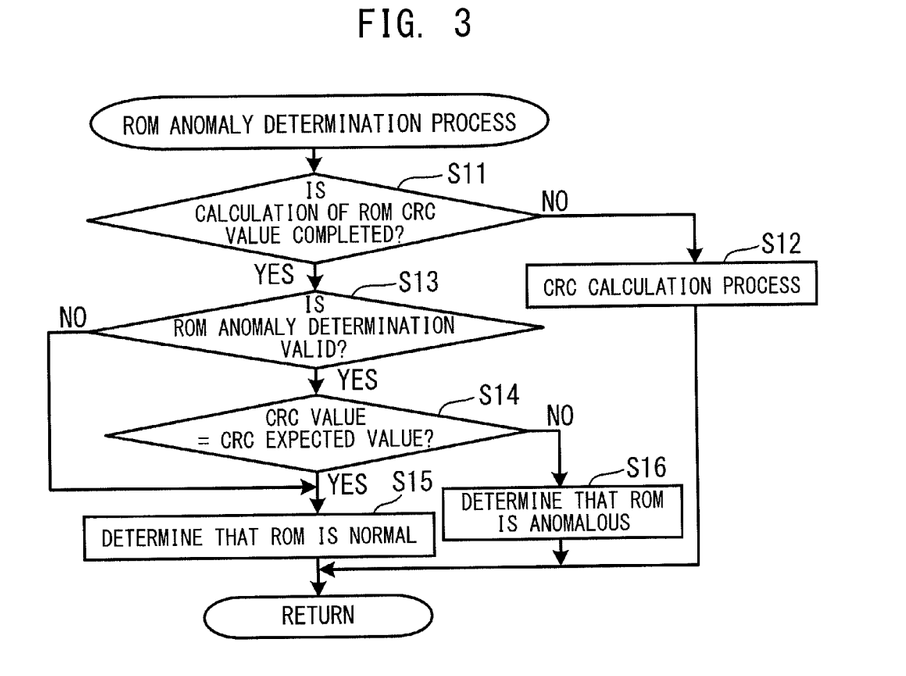
FIG. 3 is a flowchart of a ROM anomaly determination process.

First, a ROM anomaly determination process shown in FIG. 3 will be described. The ROM anomaly determination process is a process for determining whether or not the contents of the ROM 12 of the microcomputer 10 are correct, by checking a CRC (Cyclic Redundancy Check) value (CRC scheme). A CRC value calculated after correct storage of various programs and the like in the ROM 12 is stored as a CRC expected value in advance, and is referred to at the time that the CRC value is checked. Notably, the CRC expected value may be stored in a storage area of the ROM 12 which is not subjected to CRC. Alternatively, a CRC expected value may be obtained in consideration of a CRC value which changes as a result of storage of the CRC expected value in the ROM 12, and stored in the ROM 12.

When the ROM anomaly determination process is called from the main process (not shown), the CPU 11 first checks whether or not the calculation of the CRC value of the ROM 12 has been completed (S11). In the case where the calculation of the CRC value has not yet been started or is being performed (S11: NO), the CPU 11 performs a CRC calculation process (S12) to thereby start or continue the calculation of the CRC value, and returns to the main process.

In the case where the calculation of the CRC value of the ROM 12 is completed while the ROM anomaly determination process is repeatedly called from the main process (S11: YES), the CPU 11 refers to the ROM anomaly flag stored in the failure diagnosis setting data storage area 31 of the EEPROM 30. In the case where the ROM anomaly flag is set to a state indicating "invalid" (in the case where the flag is OFF) (S13: NO), irrespective of the calculated CRC value, the CPU 11 does not determine whether or not the contents of the ROM 12 are normal. In this case, the CPU 11 assumes that the ROM 12 is normal (S15) in order to prevent the determination result of the ROM anomaly determination process from affecting other processes, and then returns to the main process.

Meanwhile, in the case where the ROM anomaly flag is set to a state indicating "valid" (in the case where the flag is ON) (S13: YES), the CPU 11 determines whether or not the CRC value is equal to the CRC expected value (S14). In the case where the CRC value is equal to the CRC expected value (S14: YES), the CPU 11 determines that the contents of the ROM 12 are normal (S15), and returns to the main process. However, in the case where the CRC value differs from the CRC expected value (S14: NO), the CPU 11 determines that the contents of the ROM 12 are anomalous (S16), and returns to the main process. The result of the ROM anomaly determination performed in S15 or S16 is stored in a predetermined storage area of the RAM 13, and is referred to by other programs executed by the CPU 11.

Figure 4:
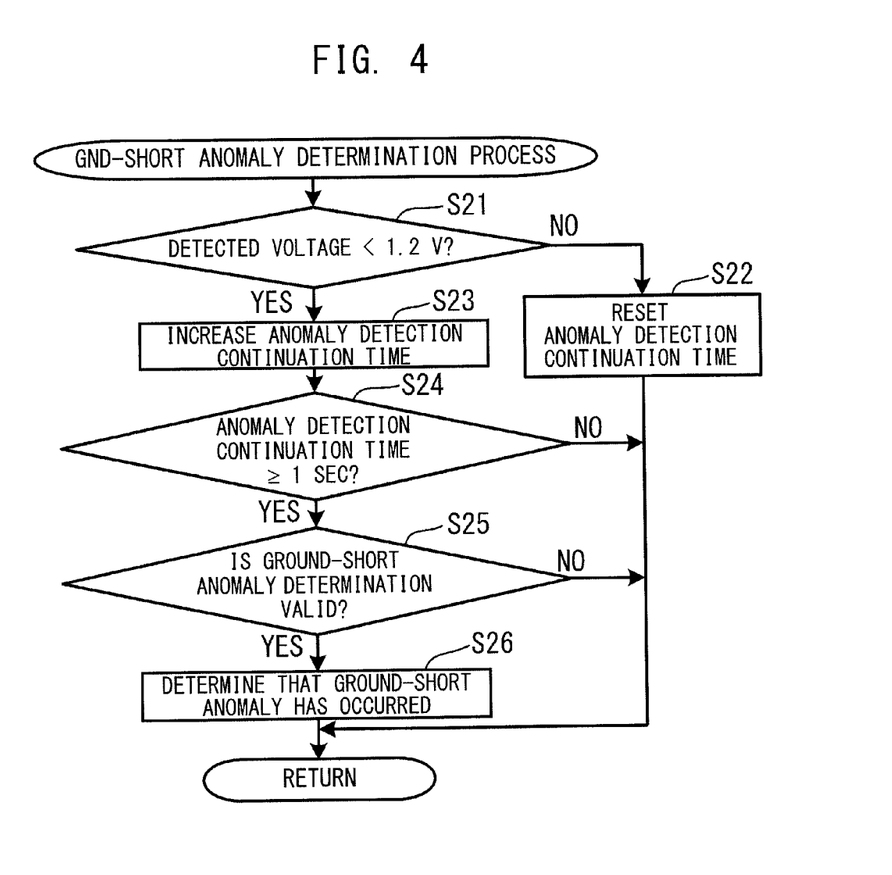
FIG. 4 is a flowchart of a GND-short anomaly determination process.

Next, a GND-short anomaly determination process shown in FIG. 4 will be described. The GND-short anomaly determination process is a process for determining whether or not a short circuit to the ground has occurred in the path for supplying electric current to the detection element 25 of the gas sensor 2. When the GND-short anomaly determination process is called from the main process, the CPU 11 checks the potential (voltage) of the port 21 detected by the anomaly detection circuit section 40 (S21). When the detected voltage is equal to or greater than 1.2 V (S21: NO), the CPU 11 determines that a short circuit is not present between the ground and the path for supplying electric current to the detection element 25. Therefore, the CPU 11 resets a timer value which represents an anomaly detection continuation time (S22), and returns to the main process.

Meanwhile, when the detected voltage of the port 21 is less than 1.2 V (S21: YES), the CPU 11 determines that a short circuit is present between the ground and the path for supplying electric current to the detection element 25. Thus, the CPU 11 adds a predetermined increment value to the timer value representing the anomaly detection continuation time (S23). In the case where the anomaly detection continuation time is less than 1 sec (S24: NO), the CPU 11 returns to the main process. So long as the voltage of the port 21, which is determined in S21 every time the GND-short anomaly determination process is repeatedly called from the main process, is less than 1.2 V, the operation of increasing the timer value, which represents the anomaly detection continuation time, is continued.

When a state in which the voltage of the port 21 is less than 1.2 V continues for 1 sec or more (S24: YES), the CPU 11 refers to the GND-short anomaly flag stored in the failure diagnosis setting data storage area 31 of the EEPROM 30. In the case where the GND-short anomaly flag is set to a state indicating "invalid" (in the case where the flag is OFF) (S25: NO), the CPU 11 assumes that a short circuit is not present between ground and the path for supplying electric current to the detection element 25, and returns to the main process.

However, in the case where the GND-short anomaly flag is set to a state indicating "valid" (in the case where the flag is ON) (S25: YES), the CPU 11 determines that a short circuit is present between ground and the path for supplying electric current to the detection element 25 (S26), and returns to the main process. The result of the GND-short anomaly determination performed in S26 is stored in a predetermined storage area of the RAM 13, and is referred to by other programs executed by the CPU 11.

Figure 5:
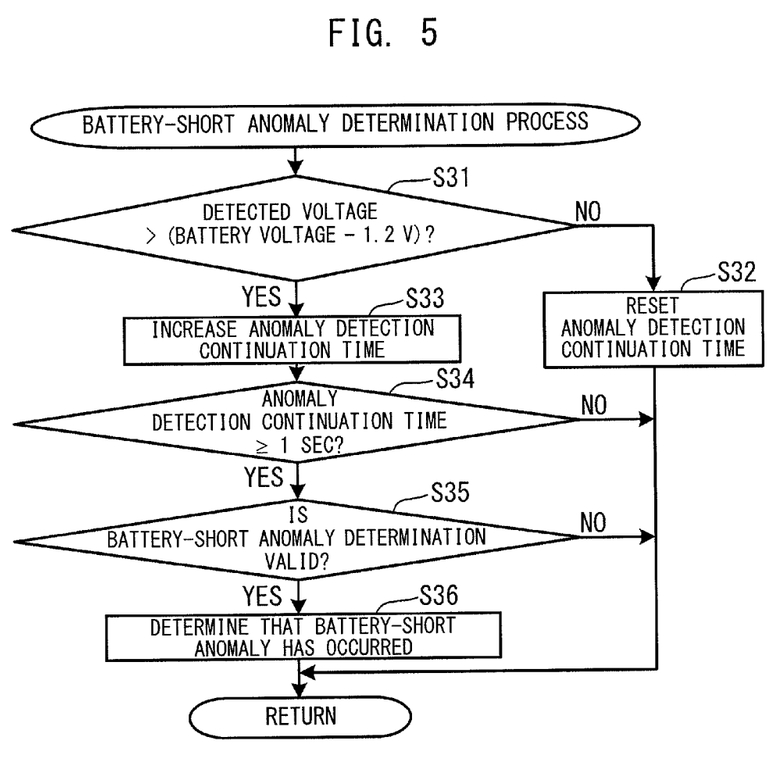
FIG. 5 is a flowchart of a battery-short anomaly determination process.

Next, a battery-short anomaly determination process shown in FIG. 5 will be described. The battery-short anomaly determination process is a process for determining whether or not a short circuit to the battery has occurred in the path for supplying electric current to the detection element 25 of the gas sensor 2. Since the details of the operation of the battery-short anomaly determination process are similar to those of the GND-short anomaly determination process, here, description of the same processing is simplified.

When the battery-short anomaly determination process is called from the main process, the CPU 11 checks the voltage of the port 21 detected by the anomaly detection circuit section 40 (S31). When the detected voltage is equal to or less than a "battery voltage minus 1.2 V" (S31: NO), the CPU 11 determines that a short circuit is not present between the battery and the path for supplying electric current to the detection element 25. Therefore, the CPU 11 resets an anomaly detection continuation time (a timer value) (S32), and returns to the main process. When the detected voltage is greater than the "battery voltage minus 1.2 V" (S31: YES), the CPU 11 determines that a short circuit is present between the battery and the path for supplying electric current to the detection element 25. Thus, the CPU 11 continues the operation of increasing the timer value until the anomaly detection continuation time reaches 1 sec (S33, S34: NO).

When a state in which the detected voltage is greater than the "battery voltage minus 1.2 V" continues for 1 sec or more (S34: YES), the CPU 11 refers to the battery-short anomaly flag stored in the failure diagnosis setting data storage area 31. In the case where the battery-short anomaly flag is set to a state indicating "invalid" (in the case where the flag is OFF) (S35: NO), the CPU 11 assumes that no short circuit is formed between the battery and the path for supplying electric current to the detection element 25, and returns to the main process. However, in the case where the battery-short anomaly flag is set to a state indicating "valid" (in the case where the flag is ON) (S35: YES), the CPU 11 determines that a short circuit is formed between the battery and the path for supplying electric current to the detection element 25 (S36), and returns to the main process. The result of the battery-short anomaly determination performed in S36 is stored in a predetermined storage area of the RAM 13, and is referred to by other programs executed by the CPU 11.

Figure 6:
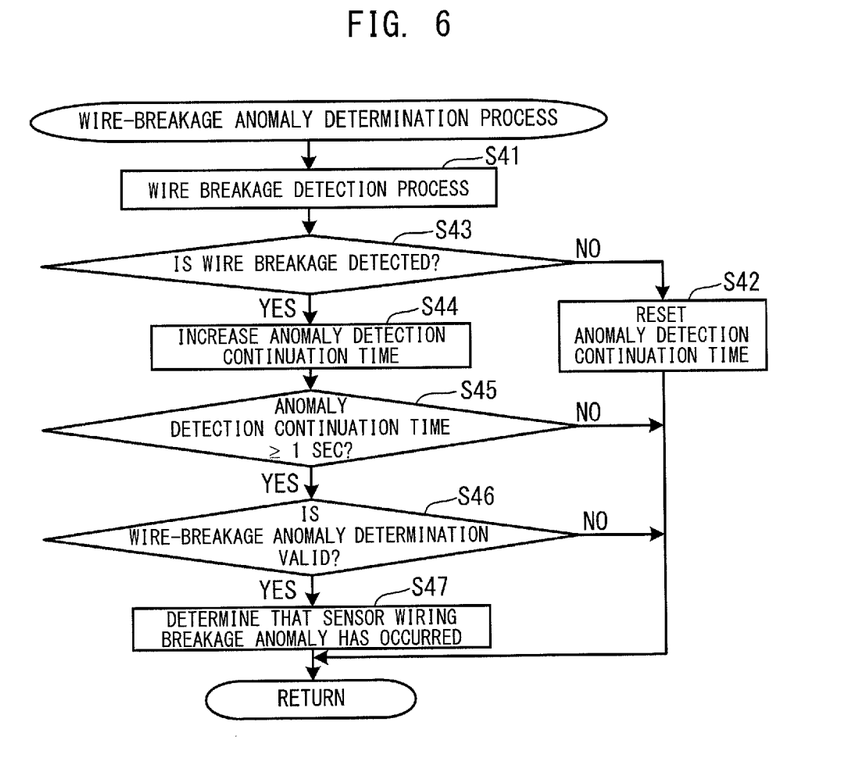
FIG. 6 is a flowchart of a wire-breakage anomaly determination process.

Next, a wire-breakage anomaly determination process shown in FIG. 6 will be described. The wire-breakage anomaly determination process is a process for determining whether or not wire breakage or conduction failure has occurred in the path for supplying electric current to the detection element 25 of the gas sensor 2. When the wire-breakage anomaly determination process is called from the main process, the CPU 11 first performs a wire-breakage detection process (S41). Specifically, the CPU 11 supplies a drive current to a wire-breakage detection circuit (not shown) of the anomaly detection circuit section 40, and detects wire breakage or the like of the path for supplying electric current to the detection element 25. In the case where the wire-breakage detection circuit outputs no wire breakage detection signal, and wire breakage or the like is not detected (S43: NO), the CPU 11 resets an anomaly detection continuation time (a timer value) (S42), and returns to the main process.

Meanwhile, in the case where the wire-breakage detection circuit of the anomaly detection circuit section 40 outputs a wire breakage detection signal (S43: YES), the CPU 11 adds a predetermined increment value to the time value, which represents the anomaly detection continuation time (S44). When the anomaly detection continuation time is less than 1 sec (S45: NO), the CPU 11 returns to the main process. When the outputting of the wire breakage detection signal continues (S41, S43: YES), the CPU 11 continues the operation of increasing the timer value until the anomaly detection continuation time reaches 1 sec (S44, S45: NO). When the state in which the wire breakage detection signal is output continues for 1 sec or more (S45: YES), the CPU 11 refers to the wire-breakage anomaly flag stored in the failure diagnosis setting data storage area 31 of the EEPROM 30. In the case where the wire-breakage anomaly flag is set to a state indicating "invalid" (in the case where the flag is OFF) (S46: NO), the CPU 11 assumes that wire breakage or the like does not occur in the path for supplying electric current to the detection element 25, and returns to the main process.

However, in the case where the wire-breakage anomaly flag is set to a state indicating "valid" (in the case where the flag is ON) (S46: YES), the CPU 11 determines that wire breakage or the like has occurred in the path for supplying electric current to the detection element 25 (S47), and returns to the main process. The result of the wire-breakage anomaly determination performed in S47 is stored in a predetermined storage area of the RAM 13, and is referred to by other programs executed by the CPU 11.

As described above, according to the sensor control apparatus 1 of the present embodiment, in the case where a certain one or more anomaly determination processes, among a plurality of determination processes (anomaly detection processes) contained in the anomaly diagnosis program, is determined valid with reference to the flags, only the determination result(s) (detection result(s)) of the certain one or more anomaly determination processes is acquired. Thus, a proper determination result can be obtained depending on the type of the vehicle or in accordance with a particular situation. That is, the CPU 11 does not execute an anomaly detection processes which is determined to be invalid with reference to a corresponding flag. Furthermore, since the ROM 12, which stores the anomaly determination processes, and the EEPROM 30, which stores the flags, differ from each other (are provided independently of each other), changing the state of the one or more flags stored in the EEPROM 30 is sufficient for obtaining a determination result from one or more desired anomaly determination processes. Accordingly, even in the case where the anomaly determination processes whose determination results are desired to be obtained change depending on the type of vehicle or in accordance with a particular situation, the anomaly diagnosis program stored in the ROM 12 does not have to be remade. Therefore, rewriting of the contents of the ROM 12 is not required. Re-making of the anomaly diagnosis program may require a programming technique. In contrast, changing the states of the flags does not require any programming technique, and can be readily performed. Therefore, the determination result of a proper determination process can be obtained in accordance with a particular situation. Moreover, in the case where the above-described determination is performed for two or more anomaly determination processes, an anomaly detection process or processes desired by a user of the control apparatus can be executed, whereby the flexibility of the control apparatus is enhanced.

Furthermore, the ROM 12 stores at least two types of anomaly determination processes; i.e., a process of checking the contents of the ROM 12 and a process of detecting at least one of a short circuit and wire breakage of the path for supplying electric current to the gas sensor 2. Thus, operation of the sensor control apparatus 1 can be checked from the viewpoint of software and hardware. Therefore, it becomes easier for a user to select the contents of the anomaly diagnosis process of the sensor control apparatus 1, and the flexibility of the sensor control apparatus 1 itself can be enhanced.

Since the determination result of each anomaly determination process is acquired after executing a series of processing steps contained in the anomaly determination process, the processing time of the anomaly determination process does not change greatly between the case where the corresponding flag is set to a state representing "valid" and the case where the corresponding flag is set to a state representing "invalid." Therefore, no influence is imposed on waiting times and timings at which other processes, containing other anomaly determination processes, are executed. Therefore, even in the case where the state of the one or more flags is changed temporarily, it is accordingly unnecessary to adjust the timings of the processes, etc. Therefore, setting of the flags can be readily performed, and time and labor can be saved.

The invention has been described by reference to the above embodiment. However, the invention should not be construed as being limited thereto. It should further be apparent to those skilled in the art that various changes in form and detail of the invention as shown and described above may be made. It is intended that such changes be included within the spirit and scope of the claims appended hereto.

For example, in the above-described embodiment, the anomaly detection circuit section 40 detects the potential (voltage) of the port 21. However, the embodiment may be configured such that the anomaly detection circuit section 40 contains a voltage comparison circuit, and outputs an anomaly reporting signal to the CPU 11 when the voltage of the port 21 deviates from a normal range.

The PC 3, which serves as an apparatus for rewriting the contents of the EEPROM 30, is a mere example. Setting of the flags may be performed not only by an apparatus including a CPU, but also by an analog circuit, switches, or the like. Further, communication via a CAN is a mere example, and rewriting of the contents of the EEPROM 30 may be performed via communication of an arbitrary protocol. The EEPROM 30 is a mere example, and other rewritable non-volatile memories, such as flash memory, may be used. Alternatively, instead of using memory devices, an equivalent function may be realized by a combination of analog switches, etc.

In the present embodiment, setting of the flags referred in the anomaly determination processes is performed by setting the flags to ON and OFF states. However, the embodiment may be modified such that several preset patterns of setting of the flags are provided, and the setting of the flags is performed by selecting one of the patterns. In the present embodiment, the ON/OFF state of each flag is designated by manipulating a corresponding bit. However, in the case of pattern selection, setting of the flags can be performed only by rewriting the storage area that designates the address at which a desired flag pattern is stored.

In the ROM anomaly determination process, the contents of the ROM 12 are checked by the CRC scheme. However, the method of checking is not limited to the CRC scheme, and other known schemes such as a parity check scheme and a checksum scheme may be used Notably, in the present embodiment, the ROM 12 corresponds to the "first storage section;" and the EEPROM 30 corresponds to the "second storage section." The gas sensor 2 corresponds to the "electric component," and the sensor control apparatus 1 corresponds to the "control apparatus." The CPU 11 corresponds to the "computation section." Moreover, the flags of the EEPROM 30 correspond to "determinants." The processing of the CPU 11 which checks in S14 whether or not the CRC value of the ROM 12 is equal to the CRC expected value corresponds to the "first checking process." The processing of the CPU 11 which determines in S24, S34, or S45 that an anomaly such as a short circuit or wire breakage has occurred when the anomaly detection continuation time becomes 1 sec or more corresponds to the "second checking process" of the invention.

This application claims priority from Japanese Patent Application No. 2010-215145 filed Sep. 27, 2010, incorporated herein by reference in its entirety.

What is claimed is:

1. A control apparatus for controlling a vehicular electric component which executes at least two types of anomaly detection processes, and which drives and controls the electric component mounted on a vehicle, the control apparatus comprising:
   a first storage section which stores at least two types of anomaly detection processes;
   a second storage section which is provided independently of the first storage section and which stores at least two determinants each being used to determine whether a corresponding one of the at least two types of anomaly detection processes is valid or invalid; and
   a computation section for executing the anomaly detection process, the computation section is configured such that, when the computation section executes each of the anomaly detection processes, the computation section refers to the corresponding determinant stored in the second storage section, and obtains a detection result of the anomaly detection process when the anomaly detection process is determined to be valid;
   wherein
   the at least two anomaly detection processes include:
   a first checking process for checking whether or not the contents of the first storage section are normal; and
   a second checking process for checking whether or not at least one of a short circuit and wire breakage has occurred at a connection line which electrically connects the control apparatus and the electric component.

2. The control apparatus for a vehicular electric component as claimed in claim 1, wherein, when the computation section executes one of the at least two types of anomaly detection processes, the computation section performs the determination with reference to the corresponding determinant after having executed a series of processing steps contained in the corresponding anomaly detection process, and obtains, as a detection result of the corresponding anomaly detection process, the result of the series of processing steps when the corresponding anomaly detection process is determined to be valid.

* * * * *